(12) United States Patent
van den Brand et al.

(10) Patent No.: US 9,450,205 B2
(45) Date of Patent: Sep. 20, 2016

(54) OPTO-ELECTRIC DEVICE AND METHOD FOR MANUFACTURING THE SAME

(71) Applicant: Nederlandse Organisatie voor toegepast-natuurwetenschappelijk onderzoek TNO, Delft (NL)

(72) Inventors: Jeroen van den Brand, Delft (NL); Joanne Sarah Wilson, Delft (NL); Antonius Maria Bernardus van Mol, Delft (NL); Dorothee Christine Hermes, Delft (NL); Edward Willem Albert Young, Delft (NL)

(73) Assignee: NEDERLANDSE ORGANISATIE VOOR TOEGEPAST-NATUURWETENSCHAPPELIJK ONDERZOEK TNO, Delft (NL)

( * ) Notice: Subject to any disclaimer, the term of this patent is extended or adjusted under 35 U.S.C. 154(b) by 0 days.

(21) Appl. No.: 14/378,944

(22) PCT Filed: Feb. 15, 2013

(86) PCT No.: PCT/NL2013/050088
§ 371 (c)(1),
(2) Date: Aug. 14, 2014

(87) PCT Pub. No.: WO2013/122463
PCT Pub. Date: Aug. 22, 2013

(65) Prior Publication Data
US 2015/0008474 A1    Jan. 8, 2015

(30) Foreign Application Priority Data

Feb. 17, 2012    (EP) ................................. 12155869

(51) Int. Cl.
*H01L 51/52*    (2006.01)
*H01L 51/50*    (2006.01)
(Continued)

(52) U.S. Cl.
CPC .......... *H01L 51/5256* (2013.01); *H01L 33/62* (2013.01); *H01L 51/5203* (2013.01);
(Continued)

(58) Field of Classification Search
CPC .......... H01L 51/5212; H01L 51/5228; H01L 51/524–51/525; H01L 51/5203–51/5234; H01L 2251/5361; H01L 51/5256
See application file for complete search history.

(56) References Cited

U.S. PATENT DOCUMENTS

| | | | |
|---|---|---|---|
| 2008/0231180 A1 | 9/2008 | Waffenschmidt et al. | |
| 2010/0076527 A1* | 3/2010 | Hammond | G09F 9/33 607/88 |

(Continued)

FOREIGN PATENT DOCUMENTS

| | | | | |
|---|---|---|---|---|
| BE | WO 2010005301 A1 * | 1/2010 | ........ | H01L 27/3202 |
| CN | 102165846 A | 8/2011 | | |

(Continued)

OTHER PUBLICATIONS

International Search Report dated Apr. 19, 2014 for PCT/NL2013/050088.
(Continued)

*Primary Examiner* — Marvin Payen
*Assistant Examiner* — Jeremy Joy
(74) *Attorney, Agent, or Firm* — Knobbe, Martens, Olson & Bear LLP (57) ABSTRACT

An opto-electric device includes an opto-electric layer structure having an anode and a cathode layer and an opto-electric layer arranged between the anode and cathode layers, and having a light-transmission side. A dual electrically conductive layer structure is arranged at a side of the opto-electric layer structure opposite the light-transmission side, the dual electrically conductive layer structure having a first and a second electrically conductive layer mutually insulated by a first electrically insulating layer. A second electrically insulating layer is arranged between the light emitting layer structure and the dual electrically conductive layer structure, wherein the first electrically conductive layer is electrically connected by at least a first transverse electrical conductor with the anode layer and the second electrically conductive layer is electrically connected by at least a second transverse electrical conductor with the cathode layer.

11 Claims, 9 Drawing Sheets

(51) Int. Cl.
*H01L 33/62* (2010.01)
*H01L 51/56* (2006.01)

(52) U.S. Cl.
CPC ....... *H01L51/5212* (2013.01); *H01L 51/5228* (2013.01); *H01L 51/5271* (2013.01); *H01L 51/56* (2013.01); *H01L 51/5234* (2013.01)

(56) References Cited

U.S. PATENT DOCUMENTS

| | | | | |
|---|---|---|---|---|
| 2011/0220903 | A1* | 9/2011 | Tauchi | H01B 1/02 257/59 |
| 2011/0297996 | A1* | 12/2011 | Van Den Brand | H01L 27/3202 257/99 |
| 2013/0087824 | A1* | 4/2013 | Van Den Brand | H01L 51/448 257/99 |

FOREIGN PATENT DOCUMENTS

| | | | | |
|---|---|---|---|---|
| CN | 102138216 B | | 3/2014 | |
| DE | WO 2011161608 A1 | * | 12/2011 | ........... H01L 51/524 |
| NL | WO 2011108921 A1 | * | 9/2011 | ........... H01L 51/448 |
| WO | 2010/005301 A1 | | 1/2010 | |
| WO | 2010005301 A1 | | 1/2010 | |
| WO | 2011/108921 A1 | | 9/2011 | |
| WO | 2011108921 A1 | | 9/2011 | |

OTHER PUBLICATIONS

Office Action dated Jan. 13, 2016 for CN Application 201380015831.

* cited by examiner

OPTO-ELECTRIC DEVICE AND METHOD FOR MANUFACTURING THE SAME

This application is the U.S. National Phase of International Application No. PCT/NL2013/050088, filed Feb. 15, 2013, designating the U.S. and published in English as WO 2013/122463 on Aug. 22, 2013 which claims the benefit of European Patent Application No. 12155869.6 filed Feb. 17, 2012.

BACKGROUND OF THE INVENTION

1. Field of the Invention

The present invention relates to an opto-electric device.

The present invention further relates to a method for manufacturing an opto-electric device.

2. Related Art

WO/2011/108921 discloses an opto-electrical device that comprises a cover, a barrier structure, an opto-electrical structure and a plurality of transverse electrical conductors. Therein the cover includes a metal foil and a patterned electrically conductive layer carried by and electrically insulated from the metal foil. The opto-electrical structure is sandwiched between the cover and the barrier structure. The opto-electrical structure comprises at least an opto-electrical layer and a transparent electrically conductive layer. The opto-electrical structure has a first main surface facing towards the cover. The plurality of transverse electrical conductors extend from the metal foil or the patterned electrically conductive layer of the cover through the at least one opto-electrical layer to said transparent electrically conductive layer. The cover extends beyond the first main surface of the opto-electrical structure. In a large area opto-electric device the transverse electrical conductors provide for a regular distribution of the voltage over the surface of the transparent electrically conductive layer. Therewith a homogeneous illumination can be achieved. In a large area photovoltaic device this construction reduces the resistive losses.

The poly(3,4-ethylenedioxythiophene):poly(4-styrenesulfonate) (PEDOT/PSS) dispersion is today the most promising and most widely used hole injecting material in OLED research and development.

PEDOT/PSS is commercially available in a number of grades as a dispersion in water (typically at 1-3% wt. solids). However, the dispersion has several drawbacks. The dispersion is very acidic because of the high loading of PSS in its acidic form. This can cause problems during application, and does not wet organic substrates without a high loading of binders or complex formulation. Unfortunately, binders decrease the conductivity of the resulting film. Moreover, many electronic applications cannot tolerate the presence of water.

An important drawback of using the PEDOT/PSS dispersion directly on a metal substrate is rapid degradation of devices, most likely due to metal migration between the metal substrate and the top electrode which is catalysed by the presence of the PEDOT. It is known for OLEDs to use a conductive metal oxide layer, e.g. indium tin oxide (ITO) as an intermediate layer between the OLED layers and a metal substrate in order to prevent such undesirable interactions whilst allowing the high conductivity of the metal substrate to provide for a regular distribution of the voltage. However, such metal oxides are brittle, expensive and need to be deposited in a vacuum. In particular for roll to roll manufacturing of flexible opto-electrical products this is a substantial disadvantage.

It is an object of the present invention to provide for an opto-electric device that allows the use of PEDOT, while avoiding the above-mentioned problems.

It is a further object of the invention for a method of manufacturing such an opto-electric device.

SUMMARY OF THE INVENTION

According to a first aspect of the present invention an opto-electric device is provided that comprises an opto-electric layer structure having an anode and a cathode layer as well as an opto-electric layer arranged between said anode and cathode layers, and having a light transmission side. Therein the cathode layer of said anode and cathode layer is closest to said light transmission side.

The opto-electric device further comprises a dual electrically conductive layer structure arranged at a side of said opto-electric layer structure opposite the light transmission side. The dual electrically conductive layer structure has a first and a second electrically conductive layer mutually insulated by a first electrically insulating layer. The first electrically conductive layer of said first and second electrically conductive layer is closest to the opto-electric layer structure.

A second electrically insulating layer is arranged between the light emitting layer structure and the dual electrically conductive layer structure. Therein the first electrically conductive layer is electrically connected by at least a first transverse electrical conductor through said second insulating layer with said anode layer and said second electrically conductive layer is electrically connected by at least a second transverse electrical conductor through said first electrically insulating layer, said first electrically conductive layer, said second electrically insulating layer, said anode electrode layer and said light emitting layer, with said cathode layer.

In the opto-electric device according to the present invention the second electrically insulating layer is arranged between the hole injection layer and the first electrically conductive layer. Therewith a chemical interaction between the hole injection layer and the first electrically conductive layer is minimized, while a reliable electrical connection is still obtained between those layers. This makes it possible to also use highly acidic dispersions, such as the PEDOT:PSS dispersion described above. In a preferred embodiment this electrical connection is obtained by the material of the hole injection layer that penetrates openings in the second electrically insulating layer. In this way separate steps for applying the electric connections are superfluous. Use of a conductive metal oxide layer such as ITO can be avoided therewith.

A method of manufacturing an opto-electric device according to the second aspect comprises the steps of providing a dual electrically conductive layer structure, having a pair of electrically conductive layers that are mutually insulated by a first electrically insulating layer, providing a second electrically insulating layer over said first electrically conductive layer, with at least a first opening that gives access to said first electrically conductive layer, depositing an anode layer and providing for at least a first transverse electrical connection that extends from the anode layer through the first opening to the first electrically conductive layer, forming at least a second opening, not overlapping the first opening, that extends through the anode layer and the first electrically conductive layer, providing a light emitting layer over the anode layer, forming at least a third opening extending towards the second electrically conductive layer, wherein in a plane defined by the first electrically conductive layer the at least a third opening has a cross-section that is surrounded with space by the cross-section of the second opening in said plane.

providing for at least a second transverse electrical connection that extends within said at least a second opening to the second electrically conductive layer, depositing a cathode layer over the opto-electric layer.

BRIEF DESCRIPTION OF THE DRAWINGS

These and other aspects are described in more detail with reference to the drawing. Therein:

FIGS. 1 and 1A show an embodiment of an opto-electric device according to the first aspect of the invention, Therein

DETAILED DESCRIPTION OF EMBODIMENTS

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

In the drawings, the size and relative sizes of layers and regions may be exaggerated for clarity.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

Like numbers refer to like elements throughout.

Figure 1:
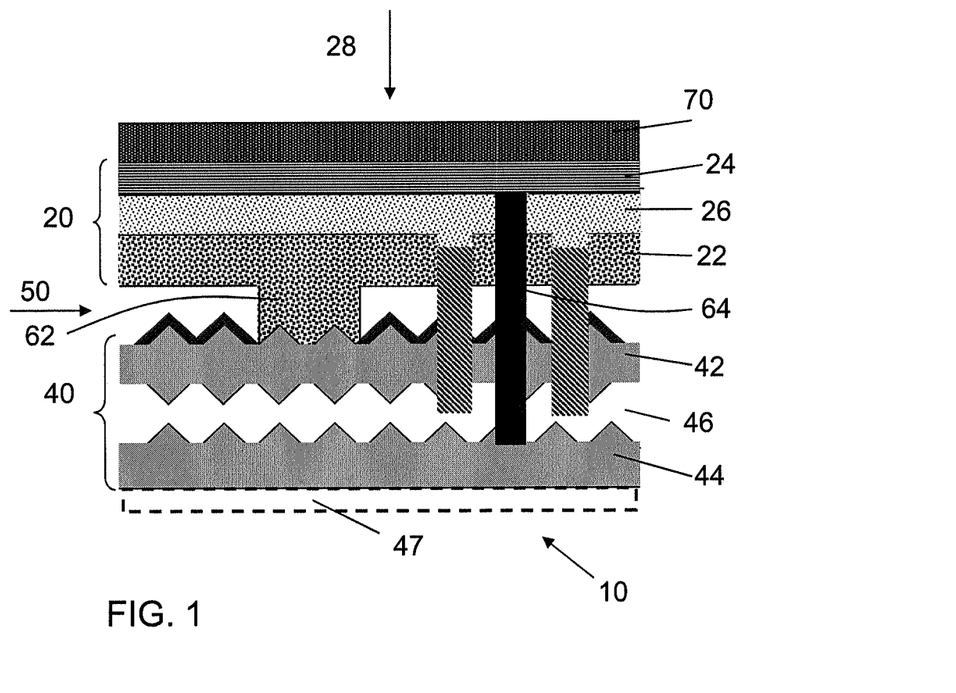
Figure 1A:
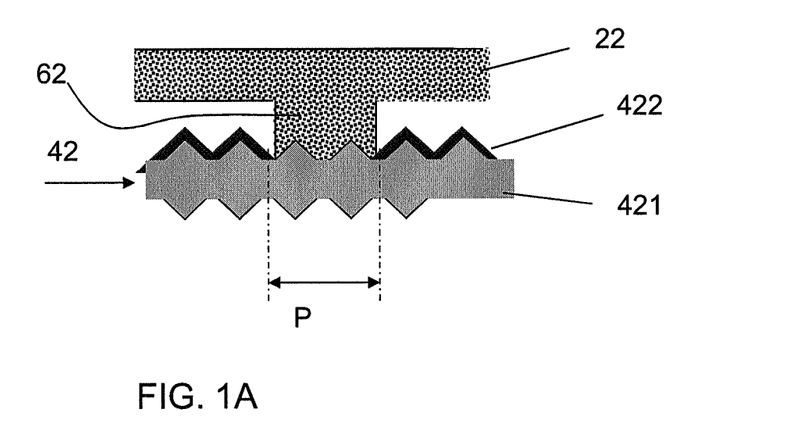
FIG. 1A shows a detail of FIG. 1, FIGS. 1B and 1C show an other detail of the embodiment of FIG. 1, Therein

FIGS. 1 and 1A show an opto-electric device. In particular the opto-electric device is a light-emitting device 10 that comprises a light-emitting layer structure 20 as the opto-electric layer structure. The light-emitting layer structure comprises an anode layer 22 and a cathode layer 24, as well as a light-emitting layer 26, forming an opto-electric layer, arranged between said anode and cathode layers. The light emitting layer structure 20 has a light transmission side, here a light output side 28. The cathode layer 24 is closer to said light-output side 28 than the anode layer 22.

The light-emitting device 10 further comprises a dual electrically conductive layer structure 40 arranged at a side of said light-emitting layer structure 20 opposite the light output side 28. The dual electrically conductive layer structure 40 has a first and a second electrically conductive layer 42, 44 that are mutually insulated by a first electrically insulating layer 46. The first electrically conductive layer 42 of the first and second electrically conductive layer 42, 44 is closest to the light-emitting layer structure 20. The electrically conductive layer 44 may be provided with an additional electrically insulating layer 47 (indicated by dashed lines) at a side facing away from the light-emitting layer structure 20. The additional electrically insulating layer 47 may provide for structural support/ease of processing/electrical isolation for the user. Various metals, e.g. including steel, stainless steel, Al, copper, molybdenum, silver, platinum, gold, chromium, or alloys such as brass, are suitable for use as the electrically conductive layer 44.

A second electrically insulating layer 50 is arranged between the light-emitting layer structure 20 and the dual electrically conductive layer structure 40. Therein the first electrically conductive layer 42 is electrically connected by at least a first transverse electrical conductor 62 through said second insulating layer 50 with said anode layer 22. The second electrically conductive layer 44 is electrically connected by at least a second transverse electrical conductor 64 through said first electrically insulating layer 46, said first electrically conductive layer 42, said second electrically insulating layer 50, said anode electrode layer 22 and said light-emitting layer 26, with said cathode layer 24.

It is advantageous if the metal used for the first electrically conductive layer 42 is a metal such as Al, Ag or Mo, having a high reflectivity. As an alternative a stack of materials having different refractive indices may be used to form a reflector (such as alternating silicon oxide and silicon nitride layers).

Typically the device is provided with an appropriate encapsulation or patterning at its edges to prevent side leakage of oxygen and water, in particular to prevent side leakage through the first and second insulating layer.

In an embodiment of the opto-electric device according to the first aspect of the present invention, here a light-emitting device, the one or more transverse electrical conductors have a minimal cross-section in the plane of the functional layer structure that is in a range of 10 to 100 µm. If the cross-section is substantially greater than 50 µm, e.g. greater than 100 µm, the transverse electrical conductors become visible. This may be less desirable in some applications. Nevertheless, for other applications transverse electrical conductors having a larger minimal cross-section e.g. of 1 or 2 mm may be used. This has the advantage of a very good conductance. A reduction of the minimal cross-section below 10 µm has no added value. Moreover a reliable electric connection of such narrow transverse electrical conductors is more difficult to realize.

The relative area occupied by the one or more transverse electrical conductors is preferably less than 10% in a cross-section defined by the plane of the light-emitting layer.

In the embodiment shown the first electrically conductive layer 42 comprises a first electrically conductive sub-layer 421 and a second sub-layer 422. The second sub-layer 422 is deposited over the first electrically conductive sub-layer. The second sub-layer 422 can be relatively thin, as the first sub-layer 421 serves as an electric conductor. Accordingly, the cost of material does not limit the selection of the materials for this second sub-layer. For example the first sub-layer 421 may be a stainless steel layer having a thickness of 50 µm and the second sub-layer 422 is layer of silver, having a thickness of 100 nm. Therewith the second sub-layer 422 has a high reflectivity for light emitted by the light-emitting layer 26, i.e. a reflectivity of at least 80%. In this case the second sub-layer 422 is electrically conductive, but that is not necessary. For example the second sub-layer 422 may be formed by a stack of materials of different refractive, a stack of silicon oxide and silicon nitride sub-layers that alternate each other.

Although FIG. 1, 1A show only a single first and second transverse electrical conductor, in practice a plurality of such transverse conductors may be provided, dependent on the size of the light-emitting device or other opto-electric device. In an embodiment the light-emitting device or other opto-electric device comprises for example per square meter 100 to 500.000 of each of the transverse electrical conductors. In a typical embodiment a light-emitting device comprises about 50.000 pairs of transverse electrical conductors per square meter.

In the embodiment shown, the second sub-layer 422 is absent at locations P where the at least a first transverse electrical conductor 62 is electrically connected with said first electrically conductive layer 42. In an alternative embodiment the second sub-layer 422 is provided with a passivation layer at least in those locations.

The at least a first transverse electrical conductor 62 is formed by the material of the anode layer 22. Although the material of the anode layer directly contacts the metal layer 422, the adverse effects are strongly mitigated as the area of interaction is very small, i.e. only at the locations P as compared to the case where no second electrically insulating layer is present at all.

Figure 1B:
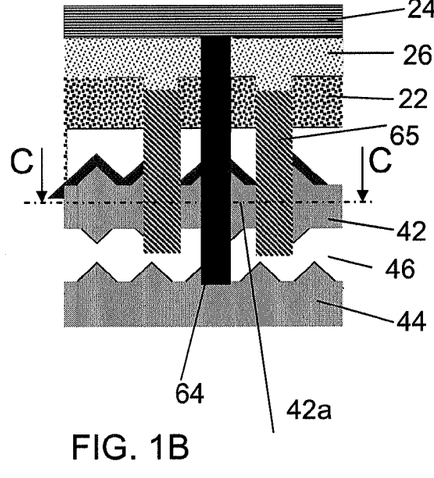
Figure 1C:
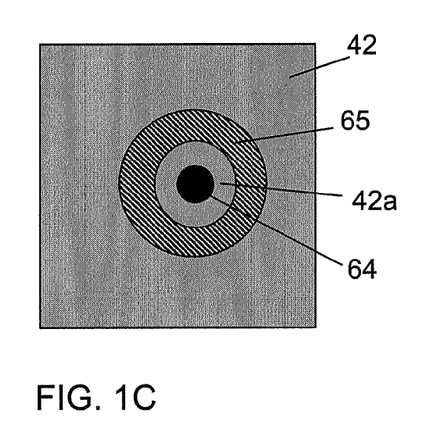
FIG. 1C shows a cross-section according to C-C in FIG. 1B, FIGS. 1D and 1E show a detail corresponding to that of FIGS. 1B and 1C in an alternative embodiment, Therein

As shown in more detail in FIGS. 1B and 1C, the at least a second transverse electrical conductor 64 extends through an insulated portion 42a of the first electrically conductive layer 42. Therein FIG. 1C is a cross-section according to C-C in FIG. 1B. The portion 42 is insulated from the remainder of the first electrically conductive layer 42 by a cylinder of an electrically insulating material that surrounds the transverse electrical conductor 64 with space.

Figure 1D:
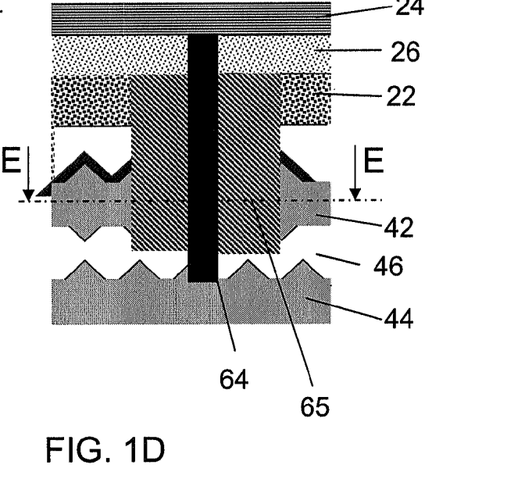
Figure 1E:
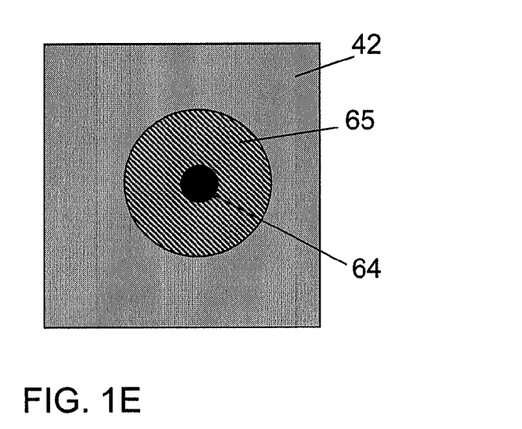
FIG. 1E shows a cross-section according to E-E in FIG. 1D, FIGS. 2A to 2T show steps of a method of manufacturing according to the second aspect of the invention.

In an alternative embodiment, shown in FIGS. 1D and 1E, the at least a second transverse electrical conductor 64 extends through a body 65 of an electrically insulating material directly adjacent to the circumference of the second transverse electrical conductor 64.

In the embodiment shown, the light-emitting device comprises a transparent barrier layer 70 at said light output side 28.

The barrier layer 70 typically comprises a stack of sub-layers. In a first embodiment the barrier layer is a stack comprising an organic sub-layer sandwiched between a first and a second inorganic sub-layer. The stack may comprise further organic and inorganic sub-layers that alternate each other. The organic sub-layers may comprise a moisture getter. Alternatively a barrier layer may comprise a stack of sub-layers of different inorganic materials that alternate each other.

An embodiment of a method according to the second aspect is now described in more detail with reference to FIG. 2A through FIG. 2T. These Figures are presented pairwise, wherein a top one of the Figures shows a detail of the semi-finished product in cross-section, and the bottom one shows a larger portion of the semi-finished product in a cross-section or in a top-view.

Figure 2A:
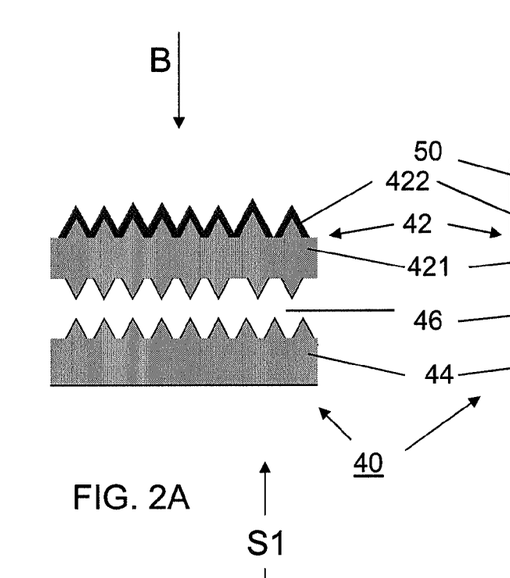
Figure 2B:
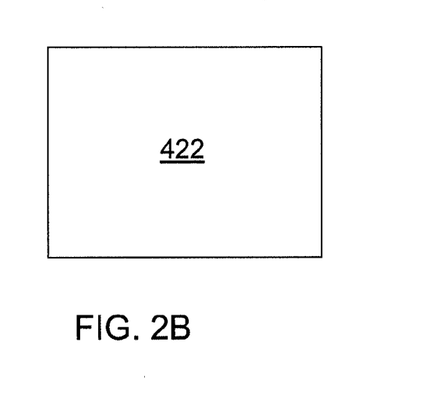

FIGS. 2A and 2B shows a first step S1 of the method, providing a dual electrically conductive layer structure 40, having a pair of electrically conductive layers 42, 44 that are mutually insulated by a first electrically insulating layer 46. FIG. 2B is a top-view according to B in FIG. 2A.

Various materials are suitable for said electrically conductive layers 42, 44 such as (stainless) steel, copper, aluminium etc. It is not necessary that the electrically conductive layers 42, 44 are made of the same material. The electrically conductive layers 42, 44 may be provided as a metal coating on the first electrically insulating layer 46. Typically such coatings have a thickness in the range of 30 nm to 1 µm. The metal coating is for example obtained by evaporation sputtering, or electroplating of a material onto the insulating layer, or by printing of a conductive ink. Alternatively the electrically conductive layers 42, 44 may be provided by laminating a pair of metal foils on both sides of an insulating layer. Such metal foils typically have a thickness of 10 µm to 200 µm. At least one of the metal layers preferably has good oxygen and water barrier properties, so that a separate barrier layer is not necessary. It is desirable for the top metal layer 42 to be very reflective (>80%), or preferably at least 90%. According to one embodiment the top metal layer 42 comprises a first sub-layer 421 that is coated by a second sub-layer 422 of a highly reflective material such as Al or Ag and having a thickness in the range of 30 nm-1 µm for example. In addition the combination of the insulating layer 46 and the sub-layers 422 and 421 can be used to tune the topology of the top-layer 42. For example a patterned topology can be used to control the amount of scattering and therefore the angle dependence of light emission out of the device structure, and/or to create a local area of patterning for example for a signage device. Techniques for patterning the insulating or conducting layers include, for example, embossing, imprinting, or printing of the metallic or insulating layers in a way which does not allow them to fully reflow to make a smooth surface. In the case where a rough metallic foil is used for the sub-layer 421, but a smooth reflective surface is required, it may be possible to achieve some degree of smoothing by providing the reflective sub-layer 422 with a deposition technique as printing or coating from solution.

The insulating material between the two metal layers could be, for example, glue, a plastic foil (typically having a thickness in the range of 1 μm-200 μm), e.g. a PET or PEN foil, a plastic material deposited from solution and cured to make a solid layer (e.g. photoresist), a stack of inorganic materials such as silicon nitride, silicon oxide or aluminium oxide, or a stack of organic and inorganic materials. Preferably all layers are mechanically stable on flexing of the device. The insulating layer 46 when applied as a coating may be thinner e.g. in the range of 10 nm-50 μm.

Figure 2C:
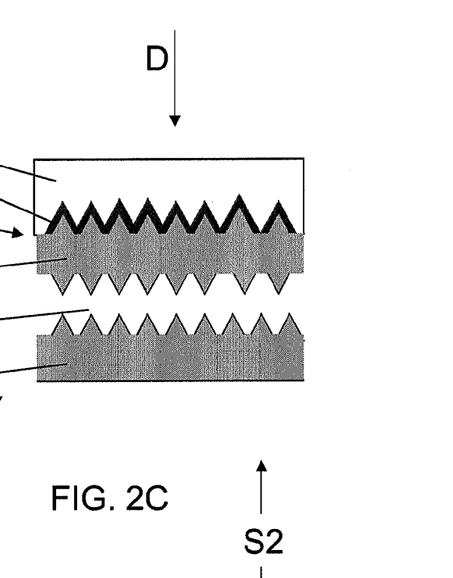
Figure 2D:
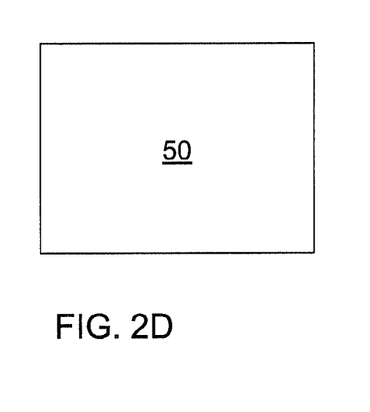
Figures 2E, 2G:
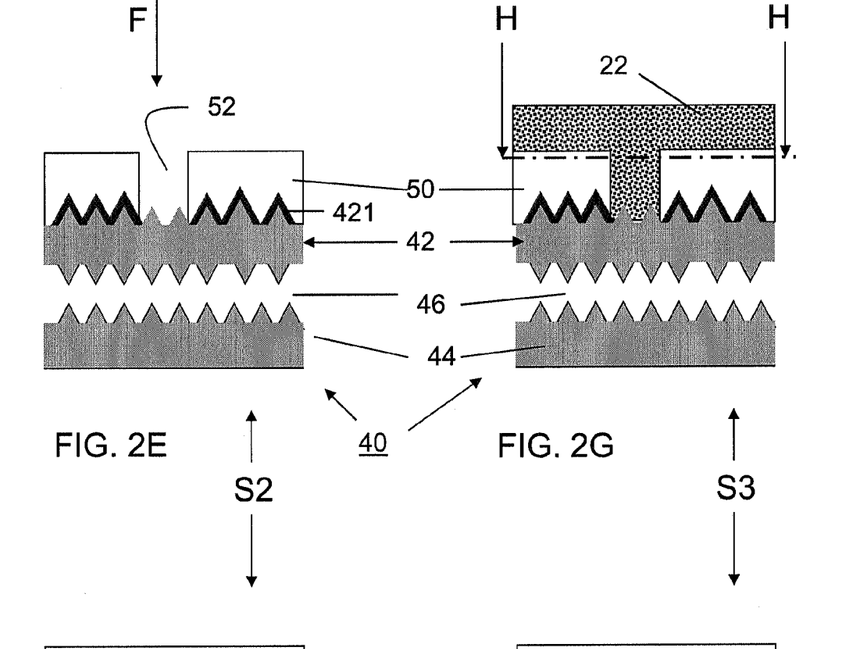
Figure 2F:
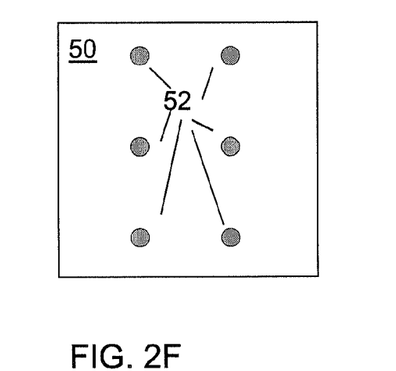

FIGS. 2C, 2D, 2E and 2F show a second step S2. Therein FIG. 2D shows a top-view according to D in FIG. 2C and FIG. 2F shows a top-view according to E in FIG. 2C. In the second step a second electrically insulating layer 50 is provided over the first electrically conductive layer 42 (FIG. 2C, 2D). The second electrically insulating layer 50 forms part of the optical microcavity of the device. Its thickness therefore preferably is in the range of 1 nm-1 μm.

As further shown in FIG. 2E, 2F the second electrically insulating layer 50 is provided with at least a first opening 52 that gives access to said first electrically conductive layer 42, e.g. by laser drilling. Alternatively the first openings may be provided by photolithography or by a lift-off technique for example. Providing the second electrically insulating layer 50 and provided at least a first opening 52 therein may be carried out by a first and a second substep as illustrated for this embodiment. Alternatively, a patterned a second electrically insulating layer 50 may be deposited in a single step, e.g. by a printing process. The openings can have any shape, and can be formed according to any pattern. In this way it is also possible to create a pattern for signage applications. In an embodiment the openings have a rectangular shaped cross-section with a length/width ratio of at least 10 in the plane of second electrically insulating layer 50. This allows for a high conductance for the transverse electrical conductors to be arranged in these openings, while the required openings can be formed easily by scratching.

As can further be seen in FIG. 2E, 2F, the second sub-layer 421 is locally removed at locations where the at least a first transverse electrical conductor 62 (See FIG. 2G) will be electrically connected with said first electrically conductive layer. Alternatively a passivation layer may be applied over the second sub-layer 421 at least in those locations. If such a passivation layer is applied only in those locations, it does not need to have a high reflectivity. Suitable metals for this purpose are stainless steel or molybdenum for example. Alternatively a thin layer (e.g. ≤1 nm) of an insulating material may be applied. The latter mitigates metal migration, but is still conductive enough to allow electric supply of the anode.

Figure 2H:
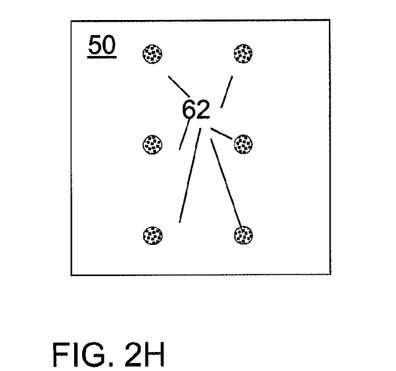

FIGS. 2G, 2H show a third step S3. Therein FIG. 2H shows a cross-section according to H-H in FIG. 2G. In the third step an anode layer 22, having a thickness in the range of 10 nm to 1 μm, is deposited. The deposited material of the anode layer penetrates into the at least a first opening 52, and therewith forms at least a first transverse electrical connection that extends from the anode layer through the opening to the first electrically conductive layer 42. In this way adverse effects due to a chemical interaction between the deposited material of the anode layer 22 and the first electrically conductive layer 42 are mitigated at least in the opto-electric active areas of the device, e.g. the light-emitting or photo-voltaic areas of the device, while avoiding separate steps for providing transverse electrical conductors 62 between the anode layer 22 and the first electrically conductive layer 42. In addition the electrically insulating layer 50 may provide some degree of planarization if there is any topology in layer 42 which could adversely affect the coating uniformity of the anode layer 22.

Figure 2I:
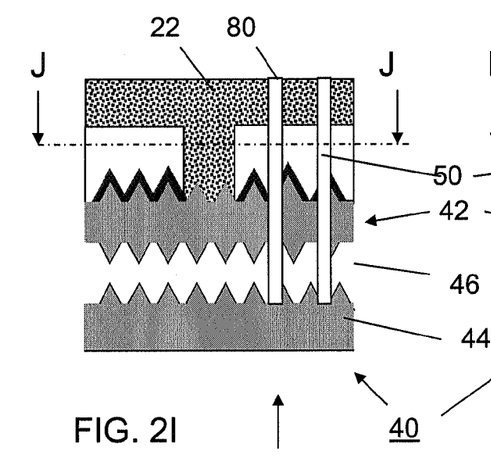
Figure 2J:
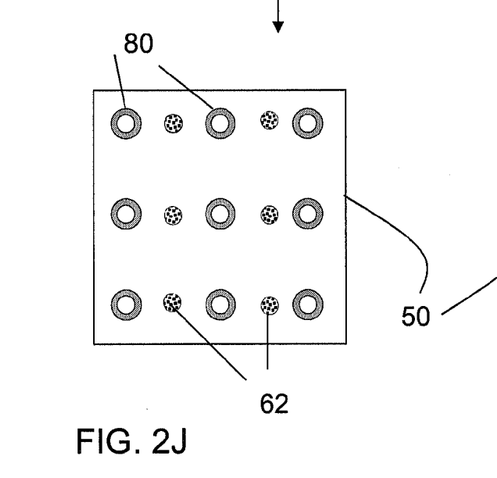

FIGS. 2I, 2J show a fourth step S4. Therein FIG. 2J shows a cross-section according to J-J in FIG. 2I. In the fourth step at least a second opening 80 is provided that extends through the anode layer 22, the second insulating layer 50, the first electrically conductive layer 42 and the first insulating layer 46. The second opening 80 may be obtained by laser drilling, by lithography or by a lift-off technique for example. The part of the opening extending through the anode layer 22 may alternatively be formed by position of this layer according to a pattern already including these openings, e.g. by printing.

The at least a second opening 80 does not overlap the first opening 52, wherein now the at least a first transverse conductor 62 is arranged. In this embodiment of the method the fourth step is followed by a substep S4A, wherein the second openings 80 are filled with an electrically insulating material 65, e.g. a curable resin that is cured after filling. Preferably the electrically insulating material is an oxygen and water barrier material to prevent any water from the central insulating layer in the substrate passing into the hole injection layer, therewith preventing electrical shorts. Suitable materials for this purpose are resins such as UV-curable resins, optionally filled with a getter material. Alternatively the first electrically insulating layer may be prepared with barrier wall structures 461 arranged for surrounding the second openings 80 with the electrically insulating material 65, shown by way of example by dashed lines for one of those filled openings. In this case penetration of moisture via the first insulating layer towards the filled openings 80+65 is prevented, so that the material 65 in the openings 80 does not need to be a barrier material.

Figure 2K:
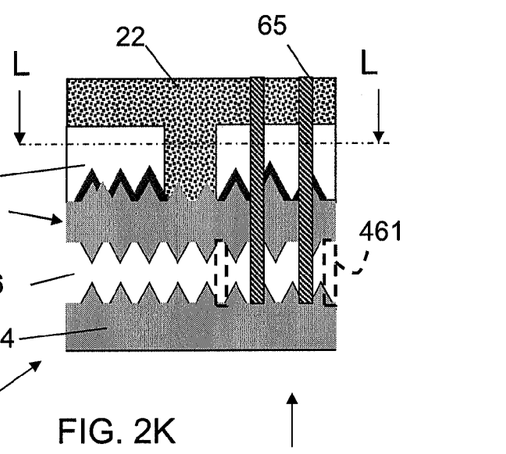
Figure 2L:
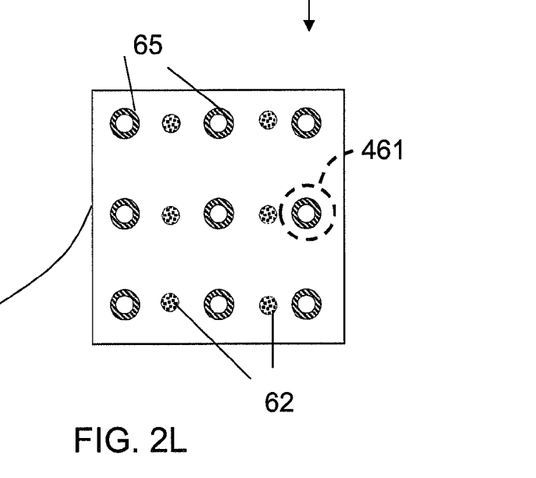

The substep 54A is illustrated in FIGS. 2K, 2L. Therein FIG. 2L shows a cross-section according to L-L in FIG. 2K.

Figure 2M:
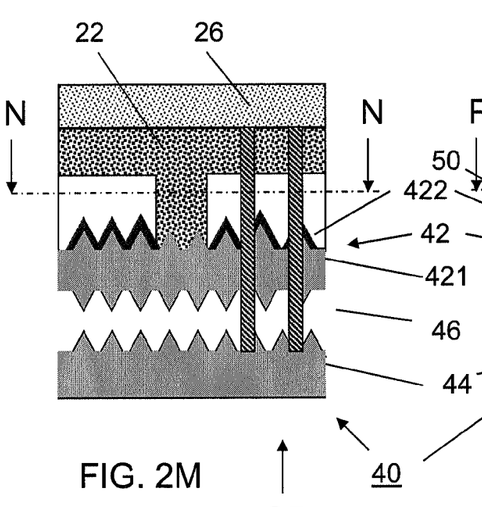
Figure 2N:
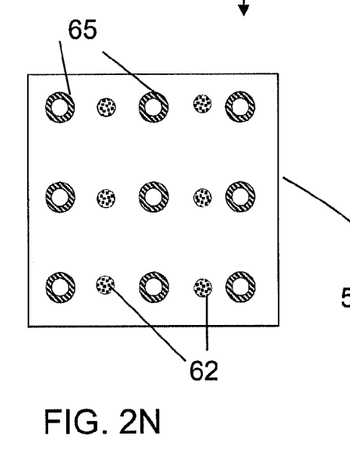

FIGS. 2M, 2N show a fifth step S5. Therein FIG. 2N shows a cross-section according to N-N in FIG. 2M. The fifth step S5 involves providing a light-emitting, photovoltaic or other opto-electric layer 26 over the anode layer 22. The opto-electric layer, or stack of layers, has a thickness in the range of 50 nm-500 nm.

Figure 2O:
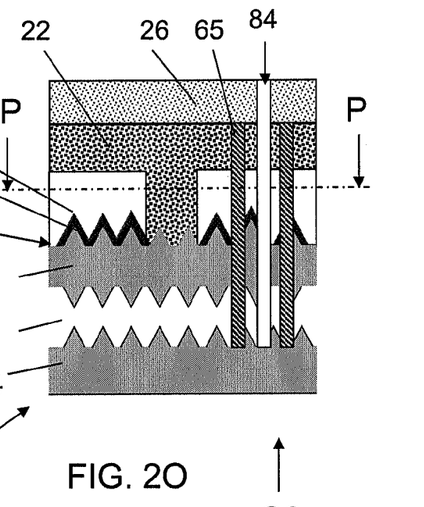
Figure 2P:
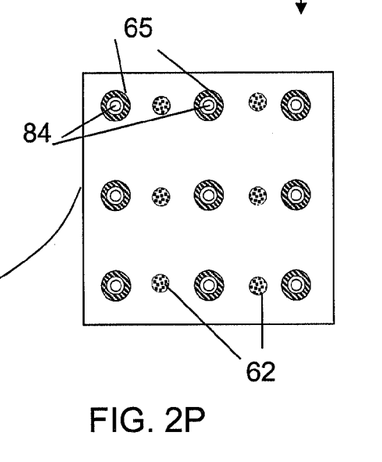

In FIGS. 2O, 2P a sixth step S6 is shown. Therein FIG. 2P shows a cross-section according to P-P in FIG. 2O. In the sixth step S6, at least a third opening 84 is formed that extends towards the second electrically conductive layer 44. In a plane defined by the first electrically conductive layer 42 the at least a third opening 84 has a cross-section that is surrounded with space by the cross-section of the second opening 80 in said plane. In the embodiment shown the second opening is filled with the electrically insulating material 65. However, in other embodiments the second openings may be left free from material.

Figures 2Q, 2S:
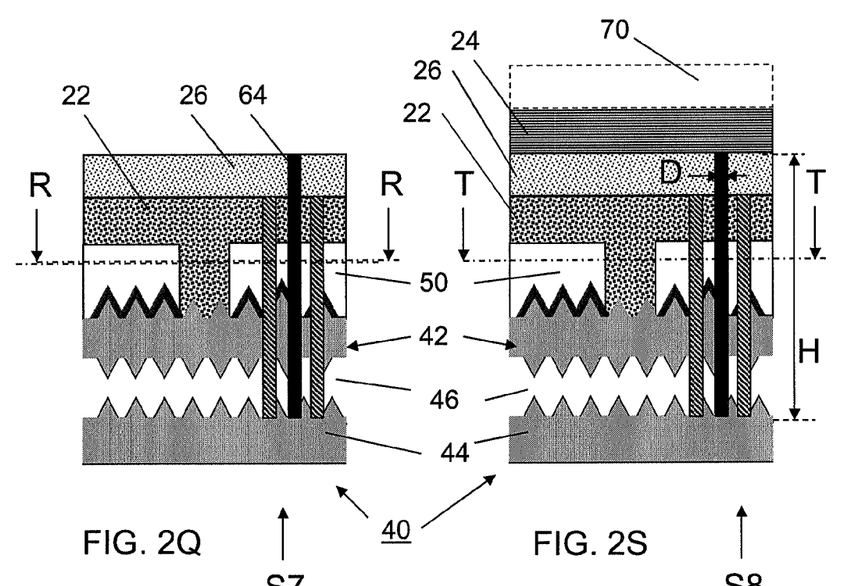
Figures 2R, 2T:
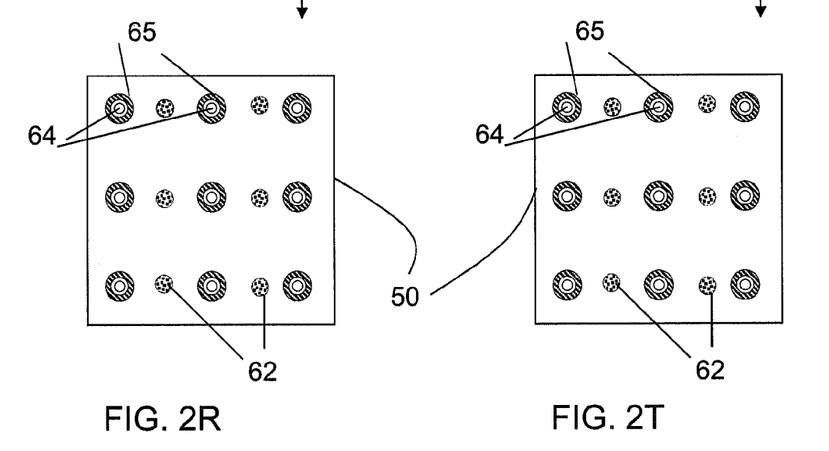

FIGS. 2Q, 2R show a seventh step S7. Therein FIG. 2R shows a cross-section according to R-R in FIG. 2Q. The seventh step S7 provides for at least a second transverse electrical connection 64, by filling the third opening 84 with an electrically conductive material. The electrical connection 64 so obtained extends within said at least a second opening, here filled with electrically insulating material 65 to the second electrically conductive layer 44. The second opening, here filled with electrically insulating material 65 forms a ring-shaped interruption in the second electrically conductive layer 42 around each transverse electrical conductor 64. Therewith a portion of the second electrically conductive layer within the ring-shaped interruption around the transverse electrical conductor forms an island in the second electrically conductive layer.

Then, in an eighth step S8, shown in FIG. 2S, 2T, a cathode layer 24 is deposited over the light-emitting layer 26. The cathode layer 24 or stack of cathode sub layers typically has a thickness of 15 nm-500 nm. In case the intermediary layers 42 and 46 are sufficiently thin, it is possible to achieve electrical contact between the cathode layer 24 and the second electrically conductive layer 44 by allowing the cathode to contact the layer 44 through the third opening 84 when it is deposited. In that case the separate step S7 of applying an additional conductive filler material is superfluous. In practice this is the case if the distance H between the cathode 24 and the second electrically conductive layer is not more than 5 times the diameter D of the transverse electrical conductor 64. In some applications it may be desired that the transverse electrical conductor have a relatively small diameter, e.g. less than 100 µm, so that they are not visible. A ratio H/D of at most 5 may be achieved if the distance H is less than 500 µm. This can be easily realized in practice, e.g. with a second electrically insulating layer in the order of a few µm, a second electrically conductive layer of a few hundred nm and a hole injection layer and a light-emitting polymer layer each having a thickness in the order of 100 nm.

FIG. 2T shows a cross-section according to T-T in FIG. 2S. Optionally, a barrier layer 70, optionally comprising a plurality of sub-layers, is deposited over the cathode layer 24. The barrier layer 70 typically has a thickness in the range 1 µm-500 µm.

Figure 3A:
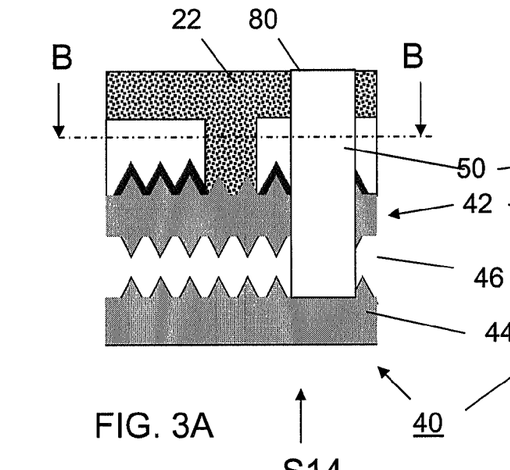
FIGS. 3A to 3H show steps in an alternative method according to the second aspect.
Figure 3B:
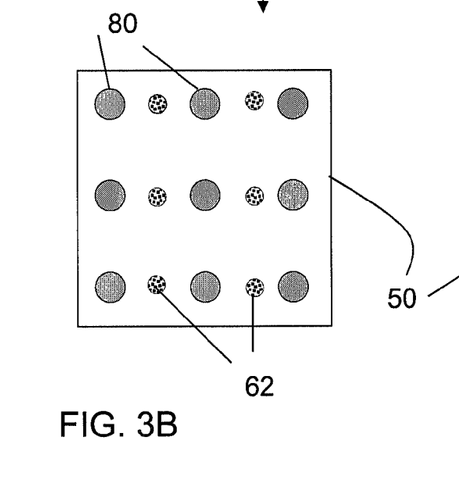

FIG. 3A to 3H shows an alternative for the steps S4 to S7. Therein FIG. 3A, 3B show a first alternative step S14 in this alternative embodiment. FIG. 3B is a cross-section according to B-B in FIG. 3A. As in step S4, at least a second opening 80 is formed that does not overlap the first opening 52, and that extends through the anode layer 22 and the first electrically conductive layer 42 to the second electrically conductive layer 44. However, in this case the at least a second opening 80 is a cylindrical hole wherein all material within its outer diameter is removed and not only a shell between an inner and an outer diameter.

Figure 3C:
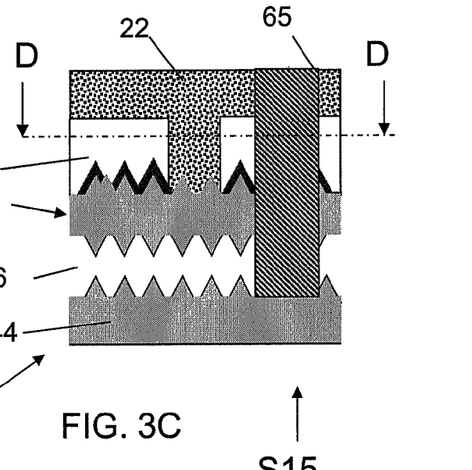
Figure 3D:
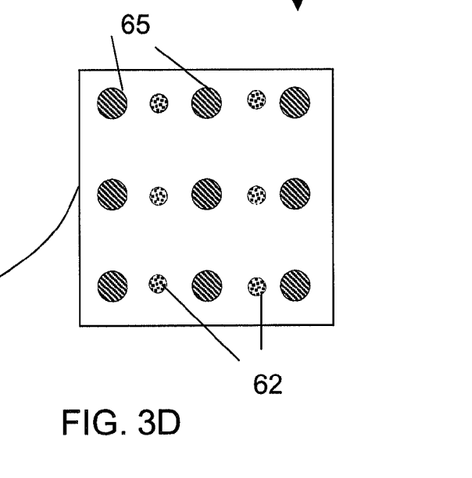

Therein FIG. 3C, 3D show a second alternative step S15 in this alternative embodiment. FIG. 3D is a cross-section according to D-D in FIG. 3B. As in step S15, the opening 80 is filled with an electrically insulating material 65, e.g. a UV-curable resin that is cured after it is applied in the opening 80. However, in this case the electrically insulating material 65 fills the entire space within the outer radius of the hole 85, and not only a shell between an inner and an outer diameter.

Figure 3E:
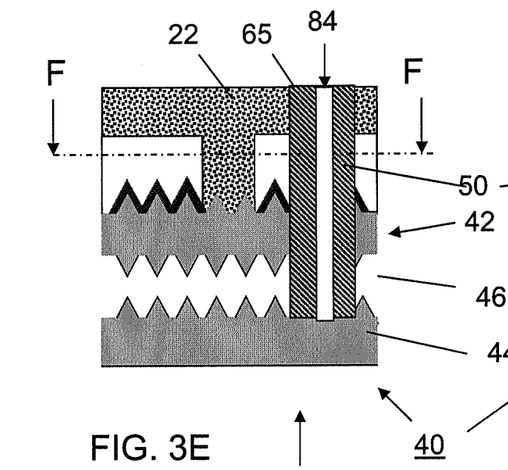
Figure 3F:
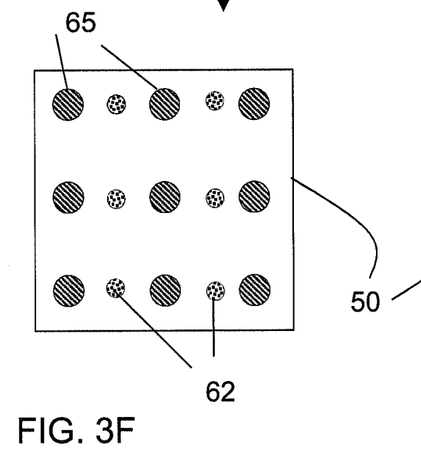

In FIGS. 3E, 3F an alternative step S16 is shown. Therein FIG. 3F shows a cross-section according to F-F in FIG. 3E. In step S16, at least a third opening 84 is formed that extends towards the second electrically conductive layer 44. In this case the opening is formed by removing of material from the electrically insulating material 65.

Figure 3G:
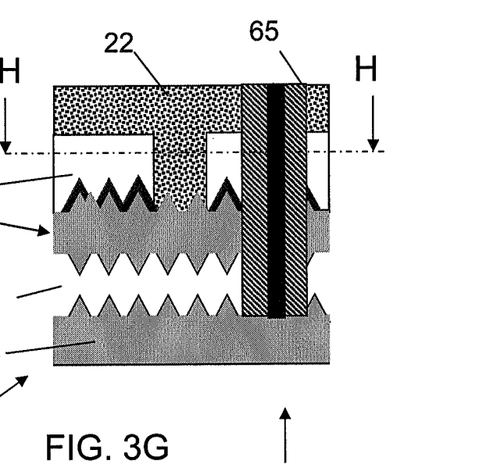
Figure 3H:
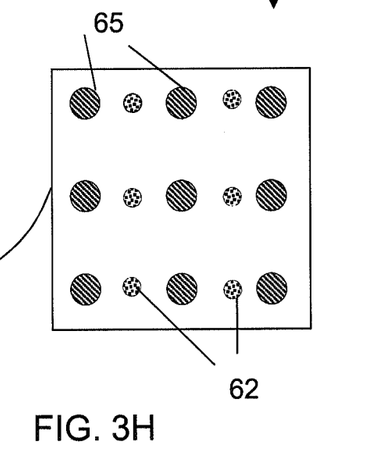

In FIGS. 3G, 3H an alternative step S17 is shown. Therein FIG. 3H shows a cross-section according to H-H in FIG. 3G. In step S17, the third opening is filled with an electrically conductive material that forms a transverse electrical conductor 64. Also here, it is possible to achieve electrical contact between the cathode layer 24 and the second electrically conductive layer 44 by allowing the cathode to contact the layer 44 through the third opening 84 when it is deposited, provided that the intermediary layers 42 and 46 are sufficiently thin. In that case the separate step S17 of applying an additional conductive filler material is superfluous.

In summary, the opto-electric device 10 according to the present invention comprises an opto-electric layer structure 20 having an anode and a cathode layer 22, 24 resp. as well as an opto-electric layer 26 arranged between said anode and cathode layers, and having a light-transmission side 28. Therein the cathode layer of the anode and cathode layer is closest to the light-transmission side. A dual electrically conductive layer structure 40 is arranged at a side of said opto-electric layer structure opposite the light-transmission side. The dual electrically conductive layer structure has a first and a second electrically conductive layer 42, 44 resp. mutually insulated by a first electrically insulating layer 46. The first electrically conductive layer 42 of the first and second electrically conductive layer is closest to the opto-electric layer structure. A second electrically insulating layer 50 is arranged between the light emitting layer structure 20 and the dual electrically conductive layer structure 40. Therein the first electrically conductive layer 42 is electrically connected by at least a first transverse electrical conductor 62 through the second insulating layer with the anode layer 22. The second electrically conductive layer 44 is electrically connected by at least a second transverse electrical conductor 64 through the first electrically insulating layer 46, the first electrically conductive layer 42, the second electrically insulating layer 50, the anode electrode layer 22 and the light emitting layer 26, with the cathode layer 24.

While the invention has been illustrated and described in detail in the drawings and foregoing description, such illustration and description are to be considered illustrative and exemplary and not restrictive; the invention is not limited to the disclosed embodiments.

Other variations to the disclosed embodiments can be understood and effected by those skilled in the art in practicing the claimed invention, from a study of the drawings, the disclosure and the appended claims. For example, in an embodiment the opto-electric device is a photo-voltaic device. The light-transmission side 28 in that embodiment is a light input side, through which the photo-voltaic device receives external photon radiation. The opto-electric layer structure 20 therein is a photo-voltaic structure with a photo-voltaic layer as the opto-electric layer 26 for converting photon radiation via the light input side in electric energy to be collected from the electrode layers 22, 24 respectively.

In the claims the word "comprising" does not exclude other elements or steps, and the indefinite article "a" or "an" does not exclude a plurality. A single processor or other unit may fulfill the functions of several items recited in the claims. The mere fact that certain measures are recited in mutually different claims does not indicate that a combination of these measures cannot be used to advantage. Any reference signs in the claims should not be construed as limiting the scope.

What is claimed is:

1. An opto-electric device comprising:
   an opto-electric layer structure having an anode and a cathode layer as well as an opto-electric layer arranged between said anode and cathode layers, and having a light-transmission side, the cathode layer of said anode and cathode layer being closest to said light-transmission side,
   a dual electrically conductive layer structure arranged at a side of said opto-electric layer structure opposite the light-transmission side, the dual electrically conductive layer structure having a first and a second electrically conductive layer mutually insulated by a first electrically insulating layer, the first electrically conductive layer of said first and second electrically conductive layer being closest to the opto-electric layer structure, a second electrically insulating layer arranged between the light-emitting layer structure and the dual electrically conductive layer structure, wherein the first electrically conductive layer is electrically connected by at least a first transverse electrical conductor through said second insulating layer with said anode layer and said second electrically conductive layer is electrically connected by at least a second transverse electrical conductor through said first electrically insulating layer, said first electrically conductive layer, said second electrically insulating layer, said anode layer and said opto-electric layer, with said cathode layer, characterized in that the at least a first transverse electrical conductor is formed by the material of the anode layer, wherein the first electrically conductive layer comprises a first electrically conductive sub-layer and a second sub-layer, the second sub-layer being deposited over the first electrically conductive sub-layer, and wherein the second sub-layer is absent at locations where the at least a first transverse electrical conductor is electrically connected with said first electrically conductive layer.

2. The opto-electric device according to claim 1, wherein the second sub-layer has a reflectivity for light emitted by the opto-electric layer of at least 80%.

3. The opto-electric device according to claim 1, wherein the at least a second transverse electrical conductor extends through an insulated portion of the first electrically conductive layer.

4. The opto-electric device according claim 1, wherein the at least a second transverse electrical conductor extends through an insulating material arranged in the first electrically conductive layer.

5. The opto-electric device according to claim 1, comprising a transparent barrier layer at said light-transmission side.

6. A method of manufacturing an opto-electric device comprising:
providing a dual electrically conductive layer structure, having a pair of electrically conductive layers that are mutually insulated by a first electrically insulating layer,
providing a second electrically insulating layer over said first electrically conductive layer, with at least a first opening that gives access to said first electrically conductive layer,
depositing an anode layer, therewith allowing material of said anode layer to penetrate in said at least a first opening, therewith forming at least a first transverse electrical conductor that extends from the anode layer through the first opening to the first electrically conductive layer,
forming at least a second opening, not overlapping the first opening, that extends through the anode layer and the first electrically conductive layer,
providing a light-emitting layer over the anode layer,
forming at least a third opening extending towards the second electrically conductive layer, wherein in a plane defined by the first electrically conductive layer the at least a third opening has a cross-section that is surrounded with space by the cross-section of the second opening in said plane
providing for at least a second transverse electrical connection that extends within said at least a second opening to the second electrically conductive layer, and
depositing a cathode layer over the opto-electric layer.

7. The method according to claim 6, wherein the first electrically conductive layer comprises a first electrically conductive sub-layer and a second sub-layer, the second sub-layer being deposited over the first electrically conductive sub-layer.

8. The method according to claim 7, comprising removing the second sub-layer at locations where the at least a first transverse electrical conductor will be electrically connected with said first electrically conductive layer.

9. The method according to claim 6, comprising forming said at least a second opening before the depositing the light-emitting layer.

10. The method according to claim 6, comprising filling said at least a second opening with an insulating material, and forming said at least a third opening within said insulating material.

11. The method according to claim 6, wherein said second opening has an annular cross-section with an inner and an outer border in said plane and the cross-section of said at least a third opening is formed within the inner border and separate from the at least a second opening.

* * * * *